United States Patent
Yoo et al.

(10) Patent No.: US 8,592,796 B2
(45) Date of Patent: Nov. 26, 2013

(54) PHASE-CHANGE RANDOM ACCESS MEMORY DEVICE AND METHOD OF MANUFACTURING THE SAME

(75) Inventors: Myoung Sul Yoo, Ichon-si (KR); Jae Min Oh, Ichon-si (KR); Ky Hyun Han, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 9 days.

(21) Appl. No.: 13/326,490

(22) Filed: Dec. 15, 2011

(65) Prior Publication Data
US 2012/0326114 A1 Dec. 27, 2012

(30) Foreign Application Priority Data
Jun. 21, 2011 (KR) .................. 10-2011-0060112

(51) Int. Cl.
*H01L 47/00* (2006.01)

(52) U.S. Cl.
USPC ............................ 257/4; 257/5; 257/E45.002

(58) Field of Classification Search
USPC ............................................................ 257/4
See application file for complete search history.

(56) References Cited

FOREIGN PATENT DOCUMENTS

| KR | 1020080070076 | 7/2008 |
| KR | 1020100097300 | 9/2010 |
| KR | 1020100107673 | 10/2010 |
| KR | 1020100110631 | 10/2010 |

*Primary Examiner* — Thien F Tran
(74) *Attorney, Agent, or Firm* — IP & T Group LLP

(57) ABSTRACT

A phase-change random access memory device includes a semiconductor substrate, an interlayer dielectric layer formed over the semiconductor substrate and having contact holes defined therein, metal contacts formed in the contact holes, an ohmic contact layer formed over the metal contacts and having recesses defined therein, and switching elements formed over the recesses of the ohmic contact layer.

6 Claims, 10 Drawing Sheets

PHASE-CHANGE RANDOM ACCESS MEMORY DEVICE AND METHOD OF MANUFACTURING THE SAME

CROSS-REFERENCES TO RELATED APPLICATION

The present application claims priority under 35 U.S.C. §119(a) to Korean application number 10-2011-0060112, filed on Jun. 21, 2011, in the Korean Intellectual Property Office, which is incorporated herein by reference in its entirety as set forth in full.

BACKGROUND

1. Technical Field

The present invention relates to a memory device, and more particularly, to a phase-change random access memory device and a method for manufacturing the same.

2. Related Art

In general, a phase-change random access memory (PRAM) device stores data using a difference in resistance between an amorphous state and a crystalline state due to a phase change of a chalcogenide compound.

FIG. 1 is a cross-sectional view illustrating a conventional phase-change random access memory device, and FIG. 2 is a photograph showing inclining of diode patterns in the conventional phase-change random access memory device.

Referring to FIG. 1, in the conventional phase-change random access memory device, metal contacts 120 are formed on a semiconductor substrate 110 using a metallic substance, and diodes 140 are formed on the metal contacts 120.

In this regard, when the diodes 140 of the conventional phase-change random access memory device may be formed of polysilicon, the adhesion force between the metal contacts 120 formed of the metallic substance and the diodes 140 formed of polysilicon becomes poor. In order to address such a feature, an ohmic contact layer 130 is formed using titanium nitride (TiN).

However, in the conventional phase-change random access memory device, titanium nitride (TiN) constituting the ohmic contact layer 130 is likely to be degraded in a subsequent annealing process, causing a problem in the interface between the titanium nitride (TiN) and polysilicon. Consequently, as shown in FIG. 2, when etching the patterns of the diodes 140 or performing a cleaning process, a phenomenon occurs in which the diode patterns incline/slant.

SUMMARY

A phase-change random access memory device and a method for manufacturing the same, which can prevent diode patterns from inclining, thereby improving the reliability of a phase-change random access memory device, are described herein.

In one embodiment of the present invention, a phase-change random access memory device includes: a semiconductor substrate; an interlayer dielectric layer formed over the semiconductor substrate and having contact holes defined therein; metal contacts in the contact holes; an ohmic contact layer formed over the metal contacts and having recesses defined therein; and switching elements formed over the recesses of the ohmic contact layer.

In one embodiment of the present invention, a method for manufacturing a phase-change random access memory device includes: providing a semiconductor substrate; forming a first interlayer dielectric layer over the semiconductor substrate, wherein the first interlayer dielectric layer has contact holes formed therein; forming metal contacts by filling a metallic substance in the contact holes; forming a second interlayer dielectric layer over the metal contacts and the first interlayer dielectric layer, wherein the second interlayer dielectric layer have holes formed therein; forming an ohmic contact layer with recesses by filling and etching titanium is nitride (TiN) in the holes; and forming switching elements over the recesses of the ohmic contact layer.

In another embodiment of the present invention, a phase-change random access memory device includes: a semiconductor substrate; a first interlayer dielectric layer formed over the semiconductor substrate and having contact holes defined therein; metal contacts formed in the contact holes; a second interlayer dielectric layer formed over the first interlayer dielectric layer and the metal contacts and having holes; an ohmic contact layer partially filling the holes; and switching elements formed over the ohmic contact layer and filling the holes.

In another embodiment of the present invention, a method for manufacturing a phase-change random access memory device includes: providing a semiconductor substrate; forming a first interlayer dielectric layer over the semiconductor substrate to have contact holes; forming metal contacts in the contact holes; forming a second interlayer dielectric layer over the metal contacts and the first interlayer dielectric layer to have holes; partially filling the holes with an ohmic contact layer; and forming switching elements over the ohmic contact layer to fill the holes.

In another embodiment of the present invention, a method for manufacturing a phase-change random access memory device includes: providing a semiconductor substrate; forming an interlayer dielectric layer over the semiconductor substrate to have contact holes; forming metal contacts by filling a metallic substance in the contact holes; partially etching the metal contacts; forming an ohmic contact layer over the etched metal contacts and over a peripheral of the interlayer dielectric layer outside the contact holes, wherein the ohmic contact layer has a cross section of a substantially U-shape; and forming switching elements over the ohmic contact layer.

BRIEF DESCRIPTION OF THE DRAWINGS

Features, aspects, and embodiments are described in conjunction with the attached drawings, in which.

DETAILED DESCRIPTION

Hereinafter, a phase-change random access memory device and a method for manufacturing the same according to the present invention will be described below with reference to the accompanying drawings through exemplary embodiments.

Figure 1:
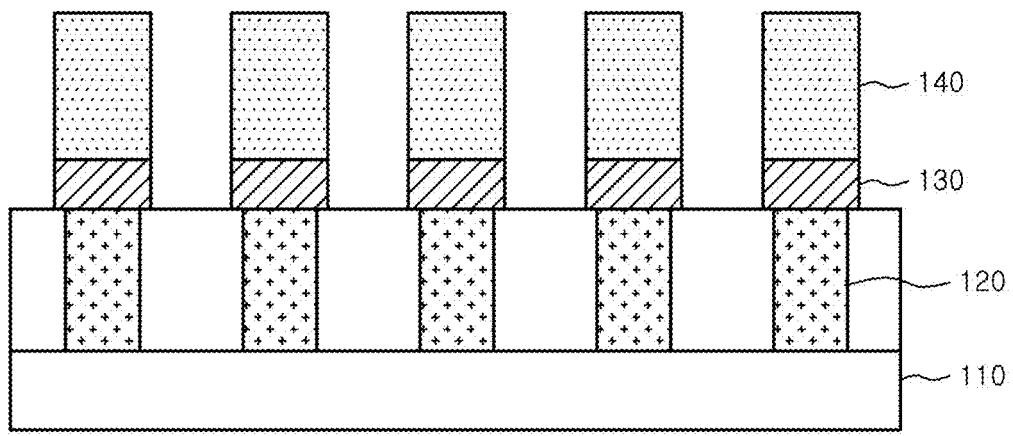
FIG. 1 is a cross-sectional view illustrating a conventional phase-change random access memory device.
Figure 2:
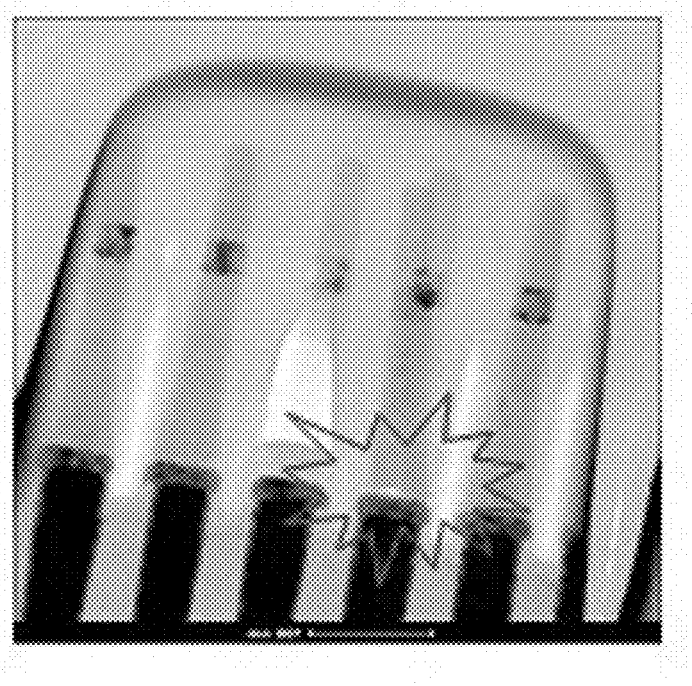
FIG. 2 is a photograph showing inclining of diode patterns in the conventional phase-change random access memory device.
Figure 3:
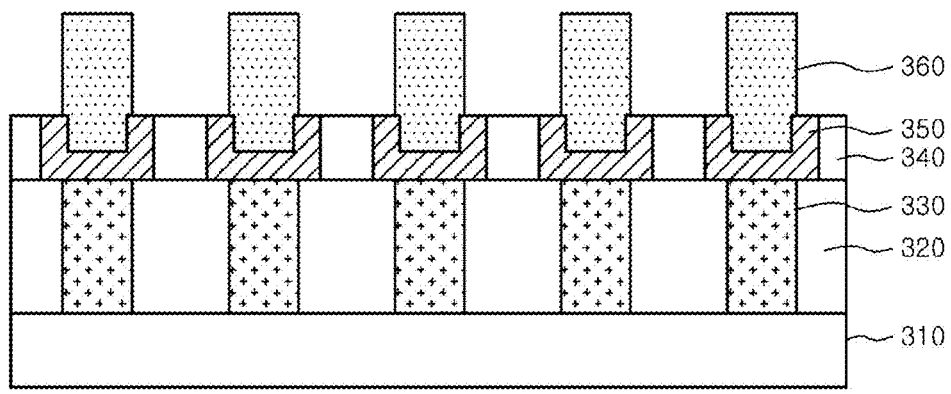
FIG. 3 is a cross-sectional view illustrating a phase-change random access memory device in accordance with a first embodiment of the present invention.
Figure 4:
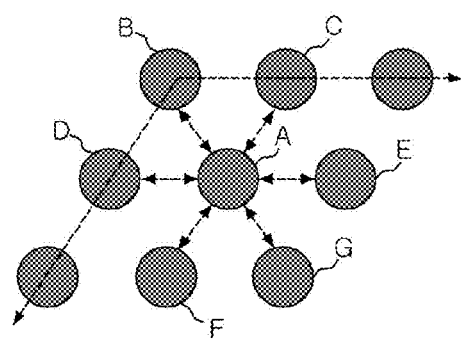
FIG. 4 is a plan view showing the arrangement of diodes in the phase-change random access memory device in accordance with the first embodiment of the present invention.

FIG. 3 is a cross-sectional view illustrating a phase-change random access memory device in accordance with a first embodiment of the present invention, and FIG. 4 is a plan view showing the arrangement of diodes in the phase-change random access memory device in accordance with the first embodiment of the present invention.

Referring to FIG. 3, in a phase-change random access memory device 300 in accordance with a first embodiment of the present invention, a first interlayer dielectric layer 320 is formed on a semiconductor substrate 310, and metal contacts 330 are formed in portions of the first interlayer dielectric layer 320 using a metallic substance. The first interlayer dielectric layer 320 may include an oxide layer.

A second interlayer dielectric layer 340 is deposited on the first interlayer dielectric layer 320 and the metal contacts 330, and an ohmic contact layer 350 is formed in portions of the second interlayer dielectric layer 340, which correspond to the metal contacts 330, to have recesses defined therein. The reason why the recesses are defined in the ohmic contact layer 350 is to increase force for supporting diodes 360, which are to be formed in a subsequent process and prevent diode patterns from inclining. The second interlayer dielectric layer 340 may include an oxide layer.

The diodes 360 are formed on the ohmic contact layer 350 using polysilicon.

The diodes 360 of the phase-change random access memory device 300 in accordance with the first embodiment of the present invention, formed in this way, may be disposed in a honeycomb shape as shown in FIG. 4. That is to say, diodes B, C, D, E, F, and G which surround a diode A are disposed at the same distance from the diode A. Therefore, the phase-change random access memory device 300 in accordance with the first embodiment of the present invention is formed such that a distance between is adjoining diodes 360, that is, a CD (critical dimension), is the same. By having the CD to be the same for adjoining diodes 360 in the phase-change random access memory device 300 in accordance with the first embodiment of the present invention, a distance between adjoining memory cells is increased, so that the adjoining memory cells are not adversely influenced by one another when performing etching and the diodes 360 may be prevented from inclining during etching.

Hereafter, a method for forming diodes of the phase-change random access memory device in accordance with the first embodiment of the present invention will be described in detail with reference to FIGS. 5a to 5e.

FIGS. 5A to 5E are cross-sectional views sequentially showing the processes of a method for forming diodes of the phase-change random access memory device in accordance with the first embodiment of the present invention.

Figure 5A:
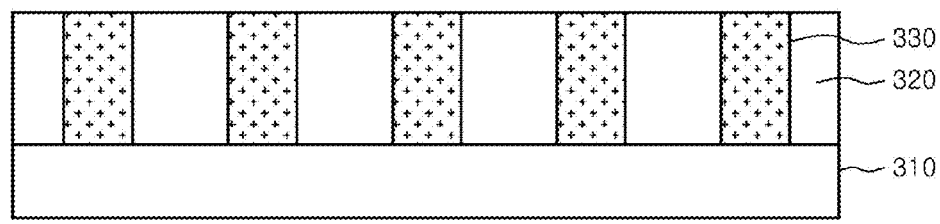
FIGS. 5A to 5E are cross-sectional views sequentially showing the processes of a method for forming diodes of the phase-change random access memory device in accordance with the first embodiment of the present invention.

Referring to FIG. 5A, a semiconductor substrate 310 is provided, and a first interlayer dielectric layer 320 is deposited on the semiconductor substrate 310 through HDP CVD (high density plasma chemical vapor deposition) to a desired height. The first interlayer dielectric layer 320 may include an oxide layer.

After creating holes by dry etching the first interlayer dielectric layer 320, metal contacts 330 are formed by filling a metallic substance, in particular, tungsten (W), in the holes.

Figure 5B:
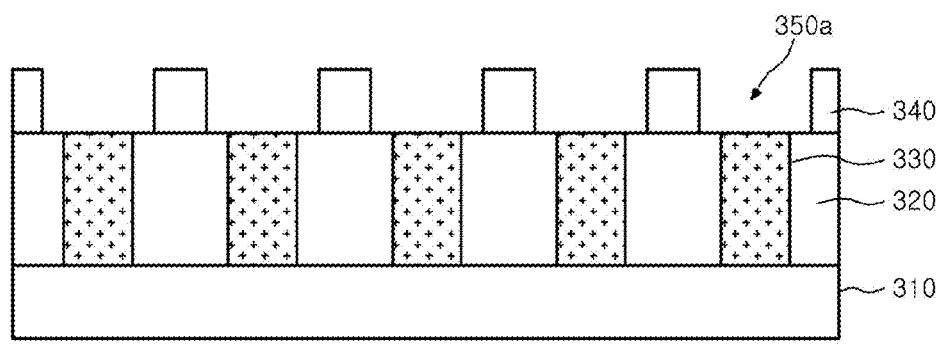

Referring to FIG. 5B, after depositing a second interlayer dielectric layer 340 on the first interlayer dielectric layer 320 and the metal contacts 330 through HDP CVD to a desired height, portions of the second interlayer dielectric layer 340, which correspond to the metal contacts 330, are etched through dry etching to expose the metal contacts 330, by which contact holes 350a are defined. The second interlayer dielectric layer 340 may include an oxide layer, and the overall deposition height of the second interlayer dielectric layer 340 may be lower than that of the first interlayer dielectric layer 320. The second interlayer dielectric layer 340 may be deposited to equal the height of an ohmic contact layer which is to be formed through a subsequent process to improve the adhesion force between the metal contacts 330 and diodes to be subsequently formed using polysilicon.

Figure 5C:
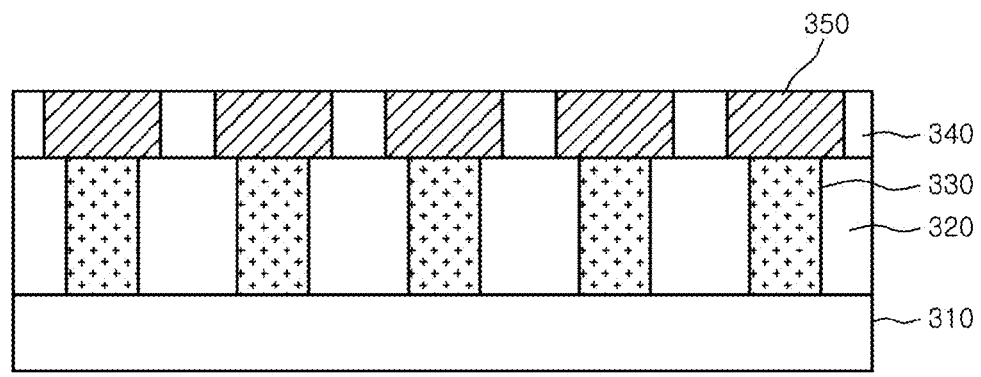

Referring to FIG. 5C, by filling titanium (TiN) in the contact holes 350a, an ohmic contact layer 350 is formed.

Figure 5D:
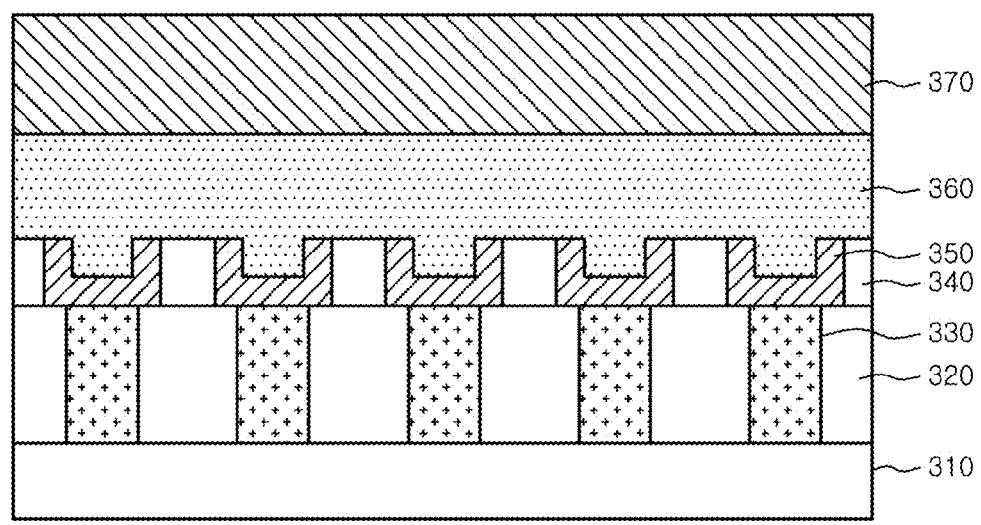

Referring to FIG. 5D, a mask pattern (not shown) is formed on a resultant structure with the ohmic contact layer 350 through well-known photolithography methods. By etching portions of the ohmic contact layer 350 which are exposed through the mask pattern, recesses are defined in the ohmic contact layer 350.

After a polysilicon layer 360 for forming diodes is deposited on the ohmic contact layer 350 defined with the recesses and on the second interlayer dielectric layer 340, a dielectric layer 370 for forming patterns of diodes is deposited on the polysilicon layer 360. The polysilicon layer 360 may be filled in the recesses of the ohmic contact layer 350, and the dielectric layer 370 may include a nitride layer.

Figure 5E:
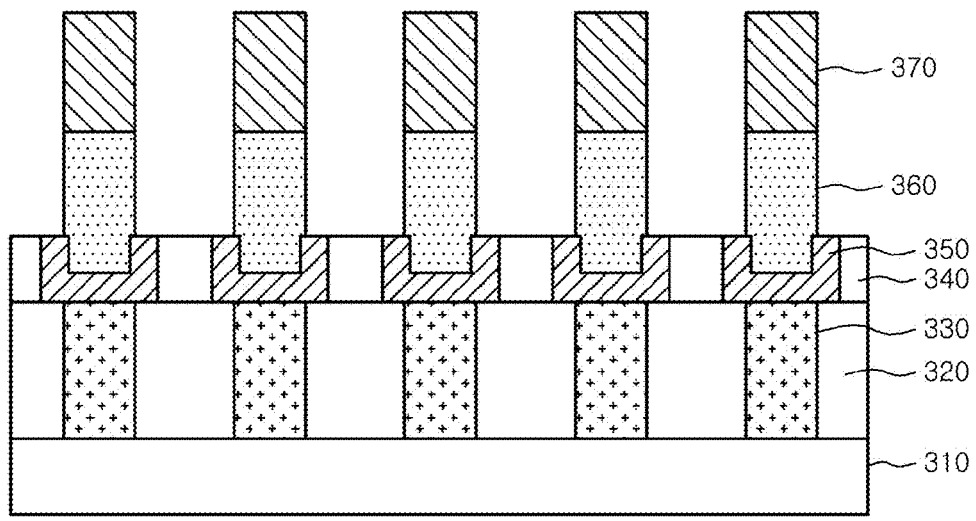

Referring to FIG. 5E, a mask pattern (not shown) is formed on the dielectric layer 370 by using well-known photolithography to expose diode forming regions. By simultaneously etching portions of the dielectric layer 370 which are exposed through the mask pattern and corresponding portions of the polysilicon layer 360, diodes 360 are formed. The dielectric layer 370 is removed in a subsequent process for further forming the phase-change random access memory device 300 in accordance with the first embodiment of the present invention.

In the phase-change random access memory device 300 in accordance with the first embodiment of the present invention and the method for manufacturing the same, the diodes 360 are formed by defining the recesses in the ohmic contact layer 350 to improve the adhesion force between the metal contacts 330 and the diodes 360. Thus, diode patterns may be prevented from inclining and adequate reliability of the phase-change random access memory device 300 may be obtained.

Also, in the phase-change random access memory device 300 in accordance with the first embodiment of the present invention and the method for manufacturing the same, the diodes 360 are disposed at the same distance from one another to thus prevent diode patterns from inclining and achieve adequate reliability of the phase-change random access memory device 300.

Hereafter, a phase-change random access memory device for preventing inclining of diode patterns in accordance with a second embodiment of the present invention and a method for manufacturing the same will be described.

Figure 6:
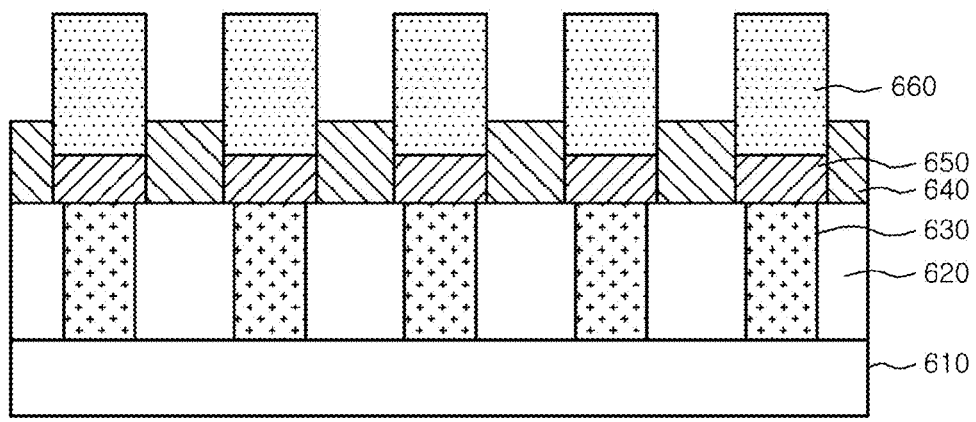
FIG. 6 is a cross-sectional view illustrating a phase-change random access memory device in accordance with a second embodiment of the present invention.

FIG. 6 is a cross-sectional view illustrating a phase-change random access memory device in accordance with a second embodiment of the present invention.

Referring to FIG. 6, in a phase-change random access memory device 600 in accordance with a second embodiment of the present invention, a first interlayer dielectric layer 620 is formed on a semiconductor substrate 610, and metal contacts 630 are formed in portions of the first interlayer dielectric layer 620 using a metallic substance. The first interlayer dielectric layer 620 may include an oxide layer.

A second interlayer dielectric layer 640 is formed on the first interlayer dielectric layer 620 and the metal contacts 630 to a desired height. An ohmic contact layer 650 made of titanium (TiN) and diodes 660 made of polysilicon are sequentially formed in portions of the second interlayer dielectric layer 640, which correspond to the metal contacts 630. The second interlayer dielectric layer 640 may include a nitride layer and may be deposited to a height reaching ⅓ of the height of the diodes 660. The reason why the deposition height of the second interlayer dielectric layer 640 is controlled in this way is to increase supporting force for the diodes 660 in a subsequent process and prevent diode patterns from inclining.

The diodes 660 made of polysilicon are formed on the ohmic contact layer 650.

In the phase-change random access memory device 600 in accordance with the second embodiment of the present invention, as can be seen from FIG. 4, memory cells may be disposed in a honeycomb shape so that they are positioned at the same distance from one another.

Hereafter, a method for forming diodes of the phase-change random access memory device 600 in accordance with the second embodiment of the present invention will be described with reference to FIGS. 7A to 7D.

FIGS. 7A to 7D are cross-sectional views sequentially showing the processes of a method for forming diodes of the phase-change random access memory device in accordance with the second embodiment of the present invention.

Figure 7A:
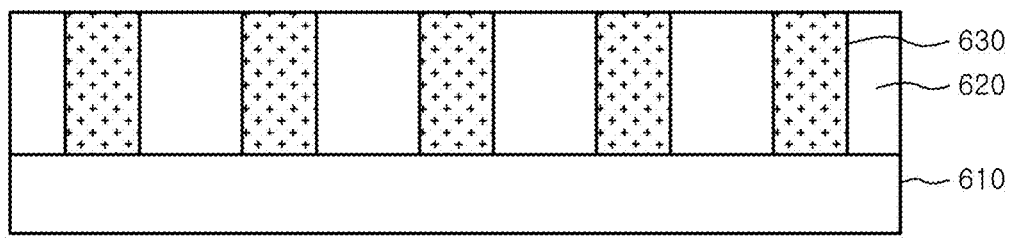
FIGS. 7A to 7D are cross-sectional views sequentially showing the processes of a method for forming diodes of the phase-change random access memory device in accordance with the second embodiment of the present invention.

Referring to FIG. 7A, a semiconductor substrate 610 is provided, and a first interlayer dielectric layer 620 is deposited on the semiconductor substrate 610 through HDP CVD to a desired height. The first interlayer dielectric layer 620 may include an oxide layer. After defining holes through dry etching of the first interlayer dielectric layer 620, metal contacts 630 are formed by filling a metallic substance, in particular, tungsten (W), in the holes.

Figure 7B:
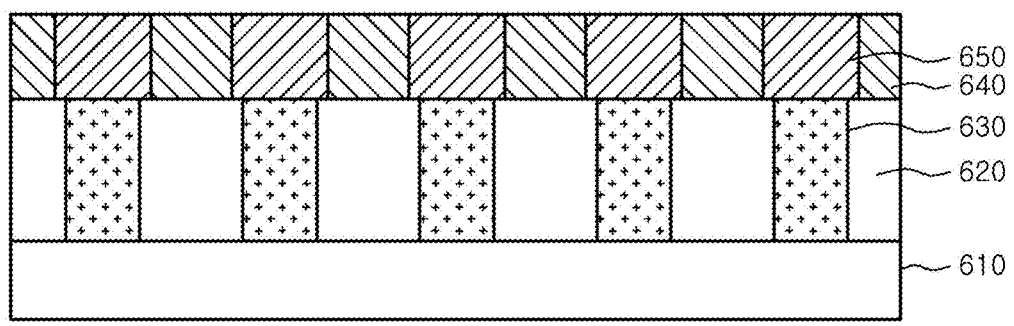

Referring to FIG. 7B, after depositing a second interlayer dielectric layer 640 on the first interlayer dielectric layer 620 and the metal contacts 630 to a desired height, portions of the second interlayer dielectric layer 640, which correspond to the metal contacts 630, are etched through dry etching to expose the metal contacts 630, by which contact holes are defined. The second interlayer dielectric layer 640 may include a nitride layer and may be deposited to a height reaching to ⅓ of the height of diodes which are to be formed in a subsequent process. By filling titanium nitride (TiN) in the contact holes defined in this way, an ohmic contact layer 650 is formed.

Figure 7C:
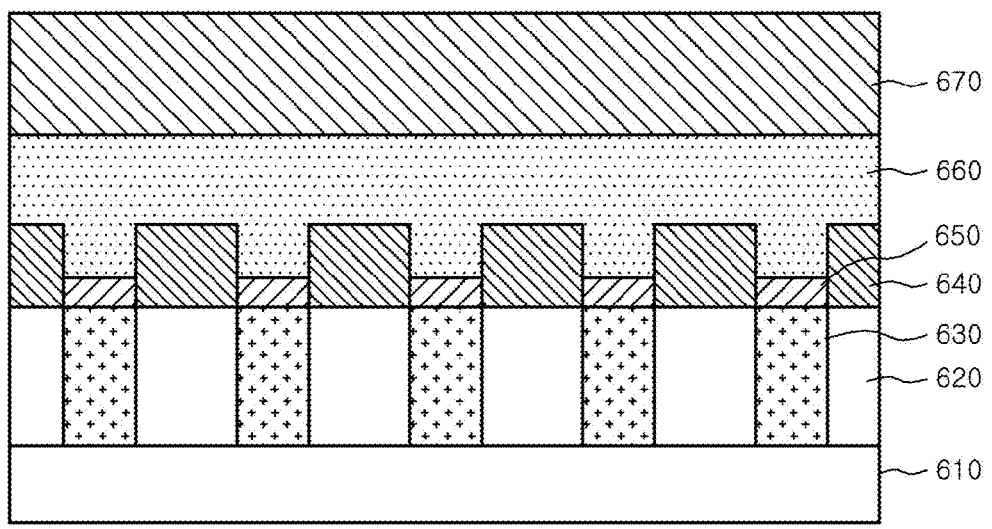

Referring to FIG. 7C, a mask pattern (not shown) is formed on the ohmic contact layer 650 by using well-known photolithography methods. By etching portions of the ohmic contact layer 650 which are exposed through the mask pattern, the ohmic contact layer 650 remains, for example, only on the bottoms of the contact holes.

After depositing a polysilicon layer 660 for forming diodes on the ohmic contact layer 650 and on the second interlayer dielectric layer 640, a dielectric layer 670 for forming patterns of diodes is deposited on the polysilicon layer 660. The dielectric layer 670 may include a nitride layer.

Figure 7D:
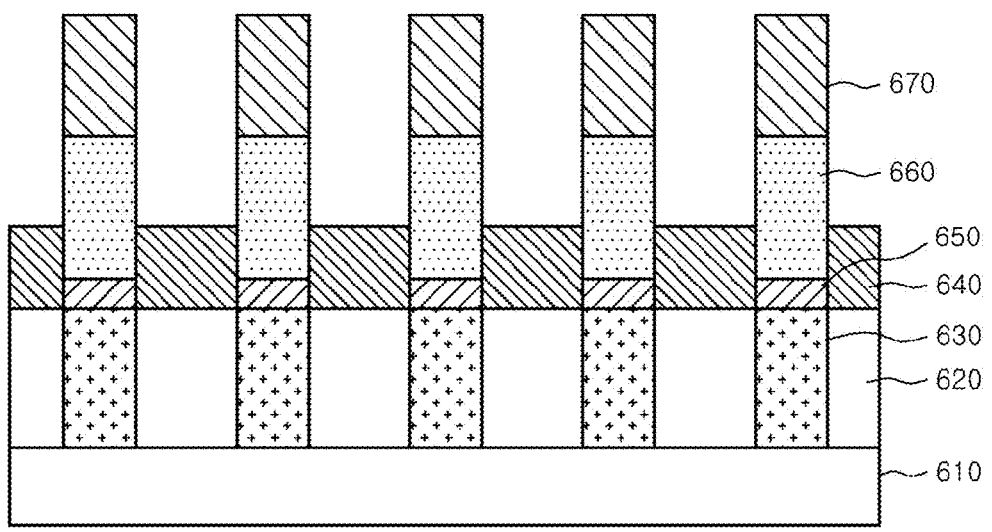

Referring to FIG. 7D, a mask pattern (not shown) is formed on the dielectric layer 670 by using well-known photolithography methods to expose diode forming regions. By simultaneously etching portions of the dielectric layer 670 which are exposed through the mask pattern and corresponding portions of the polysilicon layer 660, diodes 660 are formed. The dielectric layer 670 is removed in a subsequent process for further forming the phase-change random access memory device 600 in accordance with the second embodiment of the present invention.

In the phase-change random access memory device 600 in accordance with the second embodiment of the present invention and the method for manufacturing the same, the ohmic contact layer 650 and the second interlayer dielectric layer 640 are formed in such a way as to support portions of the diodes 660. By supporting portions of the diodes 660, diode patterns may be prevented from inclining and adequate reliability of the phase-change random access memory device 600 may be obtained.

Hereafter, a phase-change random access memory device for preventing inclining of diode patterns in accordance with a third embodiment of the present invention and a method for manufacturing the same will be described.

Figure 8:
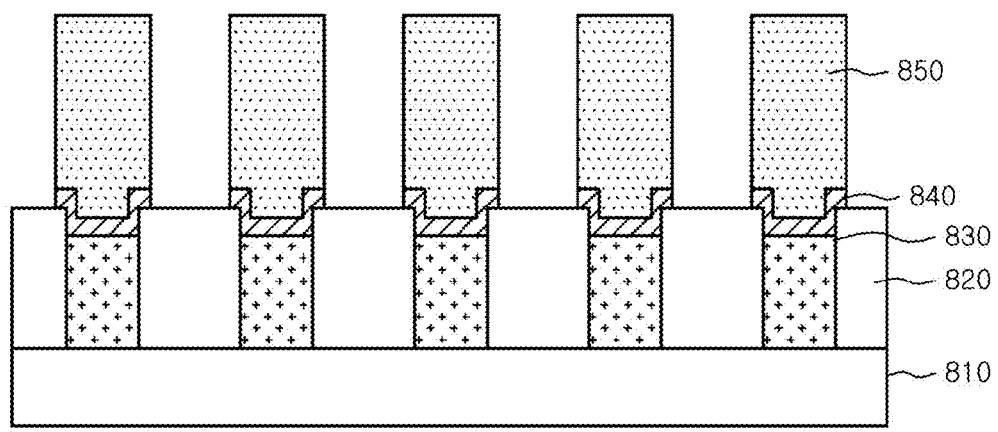
FIG. 8 is a cross-sectional view illustrating a phase-change random access memory device in accordance with a third embodiment of the present invention.

FIG. 8 is a cross-sectional view illustrating a phase-change random access memory device in accordance with a third embodiment of the present invention.

Referring to FIG. 8, in a phase-change random access memory device 800 in accordance with a third embodiment of the present invention, an interlayer dielectric layer 820 is formed on a semiconductor substrate 810, and metal contacts 830 are formed in to portions of the interlayer dielectric layer 820 using a metallic substance. The metal contacts 830 are not formed at the same height as the interlayer dielectric layer 820, but are formed at a height lower than the interlayer dielectric layer 820 due to the fact that the metallic substance for the metal contacts 830 is etched to some extent. The metallic substance is etched so as not to exert an influence on the performance of the metal contacts 830. The interlayer dielectric layer 820 may include an oxide layer.

An ohmic contact layer 840 is formed in a substantial sectional shape of U on the metal contacts 830 and on the sidewalls of the holes defined in the interlayer dielectric layer 820 due to etching of the metallic substance and on portions of the interlayer dielectric layer 820 around the holes. Diodes 850 made of polysilicon are formed on the ohmic contact layer 840.

In the phase-change random access memory device 800 in accordance with the third embodiment of the present invention, as can be readily seen from FIG. 4, memory cells may be disposed in a honeycomb shape so that they are positioned at the same distance from one another.

In the phase-change random access memory device 800 in accordance with the third embodiment of the present invention, the upper portions of the metal contacts 830 are etched, the ohmic contact layer 840 is formed in the etched portions, and the diodes 850 are formed on the ohmic contact layer 840, where diode patterns may be prevented from inclining.

Hereafter, a method for forming diodes of the phase-change random access memory device 800 in accordance with the third embodiment of the present invention will be described with reference to FIGS. 9A to 9D.

FIGS. 9A to 9D are cross-sectional views sequentially showing the processes of a method for forming diodes of the phase-change random access memory device in accordance with the third embodiment of the present invention.

Figure 9A:
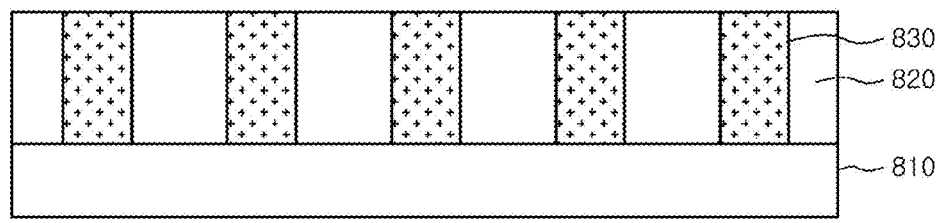
FIGS. 9A to 9D are cross-sectional views sequentially showing the processes of a method for forming diodes of the phase-change random access memory device in accordance with the third embodiment of the present invention.

Referring to FIG. 9A, a semiconductor substrate 810 is provided, and an interlayer dielectric layer 820 is deposited on the semiconductor substrate 810 through HDP CVD (high density plasma chemical vapor deposition) to a desired height. After defining holes through dry etching of the interlayer dielectric layer 820, metal contacts 830 are formed by filling a metallic substance, in particular, tungsten (W), in the holes. The interlayer dielectric layer 820 may include an oxide layer.

Figure 9B:
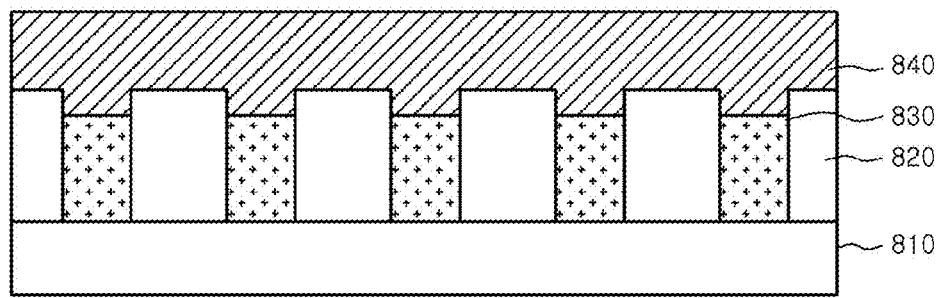

Referring to FIG. 9B, the upper portions of the metal contacts 830 are etched through an etch-back process so that the metal contacts 830 have a height lower than the interlayer dielectric layer 820. Titanium (TiN) for forming an ohmic contact layer is deposited on the metal contacts 830 etched in this way and on the interlayer dielectric layer 820.

Figure 9C:
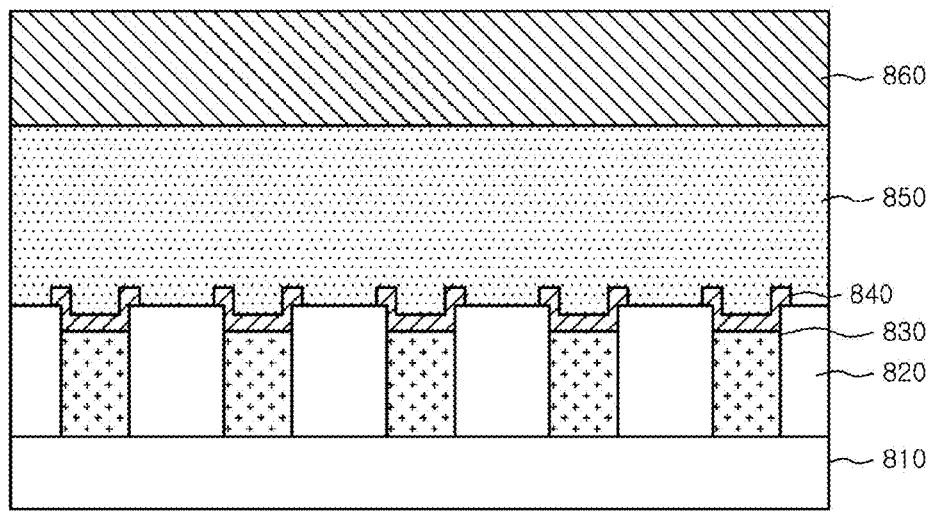

Referring to FIG. 9C, by etching the deposited titanium (TiN) to have a I sectional shape of U substantially on the metal contacts 830, on the sidewalls of the holes defined in the interlayer dielectric layer 820 due to etching of the metal contacts 830 and on portions of the interlayer dielectric layer 820 around the holes, an ohmic contact layer 840 is formed.

After depositing a polysilicon layer 850 for forming diodes on the ohmic contact layer 840 and on the interlayer dielectric layer 820, a dielectric layer 860 for forming patterns of diodes is formed on the polysilicon layer 850. The dielectric layer 860 may include a nitride layer.

Figure 9D:
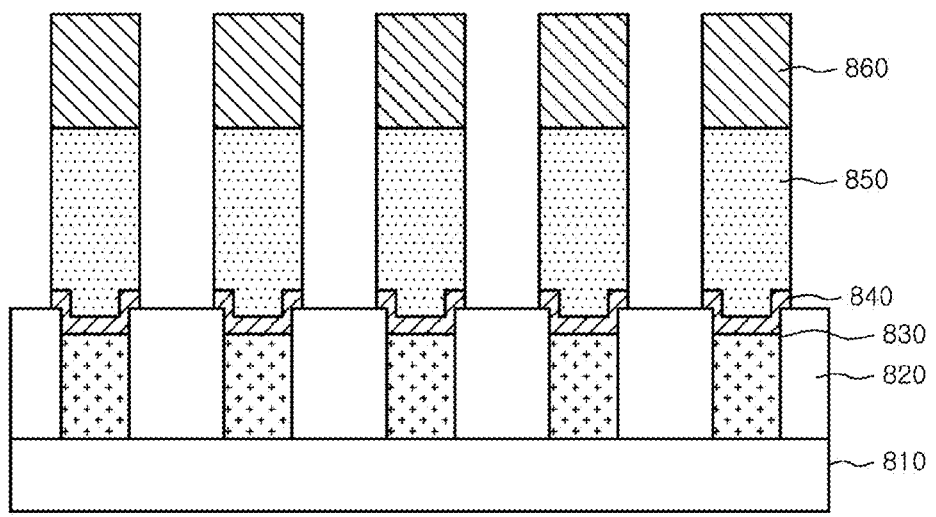

Referring to FIG. 9D, a mask pattern (not shown) is formed on the dielectric layer 860 through well-known photolithography methods to expose diode forming regions. By simultaneously etching portions of the dielectric layer 860 which are exposed through the mask pattern and corresponding portions of the polysilicon layer 850, diodes 850 are formed. The dielectric layer 860 is removed in a subsequent process for further forming the phase-change random access memory device 800 in accordance with the third embodiment of the present invention.

In the phase-change random access memory device 800 in accordance with the third embodiment of the present invention and the method for manufacturing the same, the upper portions of the metal contacts 830 are etched to allow the ohmic contact layer 840 to have a section shape of U substantially and the diodes 850 are formed on the ohmic contact layer 840. Thus, diode patterns may be prevented from inclining and adequate reliability of the phase-change random access memory device 800 may be obtained.

While certain embodiments have been described above, it will be understood to those skilled in the art that the embodiments described are by way of example only. Accordingly, the phase-change random access memory device and the method for manufacturing the same described herein should not be limited to the described embodiments. Rather, the phase-change random access memory device and the method for manufacturing the same described herein is to include all embodiments that is consistent with the above-described features of the exemplary embodiments.

What is claimed is:

1. A phase-change random access memory device comprising:
    a semiconductor substrate;
    an interlayer dielectric layer formed over the semiconductor substrate and having contact holes defined therein;
    metal contacts formed in the contact holes;
    an ohmic contact layer formed over the metal contacts and having recesses defined therein; and
    switching elements formed over the recesses of the ohmic contact layer.

2. The phase-change random access memory device according to claim 1, wherein the switching elements include at least three switching elements and are separated from one another by an equal distance.

3. The phase-change random access memory device according to claim 1, wherein the switching elements are formed of polysilicon.

4. The phase-change random access memory device according to claim 1, wherein the ohmic contact layer is formed to have a cross section of a substantially U-shape.

5. The phase-change random access memory device according to claim 4, wherein the metal contacts are formed to have a surface with a height lower than a top surface of the interlayer dielectric layer.

6. The phase-change random access memory device according to claim 1, wherein the ohmic contact layer partially fills the contact holes, extends outside the contact holes, and covers a periphery of the interlayer dielectric layer outside the contact holes.

* * * * *